(12) United States Patent
Daio

(10) Patent No.: US 8,440,956 B2
(45) Date of Patent: May 14, 2013

(54) LIGHT RECEIVING DETECTION CIRCUIT HAVING A HIGH-PASS FILTER AND AN AMPLIFYING CIRCUIT

(75) Inventor: Mitsuaki Daio, Kyoto (JP)

(73) Assignee: OMRON Corporation, Kyoto (JP)

( * ) Notice: Subject to any disclaimer, the term of this patent is extended or adjusted under 35 U.S.C. 154(b) by 462 days.

(21) Appl. No.: 12/712,778

(22) Filed: Feb. 25, 2010

(65) Prior Publication Data
US 2010/0224761 A1 Sep. 9, 2010

(30) Foreign Application Priority Data
Mar. 3, 2009 (JP) ................... 2009-049562

(51) Int. Cl.
*H01J 40/14* (2006.01)
*G06M 7/00* (2006.01)
*H03K 17/78* (2006.01)

(52) U.S. Cl.
USPC .............. 250/214 R; 250/221; 250/214 SW

(58) Field of Classification Search .............. 250/221, 250/214 R, 214 A, 214 SW, 214.1, 559.12, 250/559.13, 559.15, 559.19, 559.21, 208.2; 72/21.3, 72/14.1, 14.3; 340/507, 540, 541, 552, 555–557, 340/573.1, 600; 361/173, 175–177; 356/625, 356/627; 209/576–579, 586; 192/116.5, 129 R, 192/130, 131 R, 131 H
See application file for complete search history.

(56) References Cited

U.S. PATENT DOCUMENTS

| | | | |
|---|---|---|---|
| 4,160,160 A * | 7/1979 | Hasegawa et al. | 250/214 P |
| 4,736,097 A | 4/1988 | Philipp | |
| 2005/0109919 A1 * | 5/2005 | Osako et al. | 250/221 |
| 2005/0184786 A1 * | 8/2005 | Nishikawa | 327/276 |

FOREIGN PATENT DOCUMENTS

| DE | 3411995 A1 | 10/1985 |
|---|---|---|
| DE | 4305559 A1 | 8/1994 |

OTHER PUBLICATIONS

OMRON corporation product information [online], the Internet, <http://www.fa.omron.co.jp/product/family/1581/index_p.html>, Jan. 6, 2009.
Extended European Search Report for Application No. 10153830.4-2215, mailed on Oct. 18, 2011, 7 pages.

* cited by examiner

*Primary Examiner* — Pascal M Bui Pho
(74) *Attorney, Agent, or Firm* — Osha Liang LLP

(57) ABSTRACT

A light receiving detection circuit has a light receiving element configured to receive light emitted from a corresponding projection element, a current/voltage conversion circuit that converts a current signal passing through the light receiving element into a voltage signal, and a filter portion that has a plurality of stages. The filter portion has a high-pass filter and an amplifying circuit. The high-pass filter is able to be switched such that a time constant of the high-pass filter increases when the light receiving element receives light emitted by the corresponding projection element such that the time constant decreases when other projection elements except for the corresponding projection element emit the light.

4 Claims, 13 Drawing Sheets

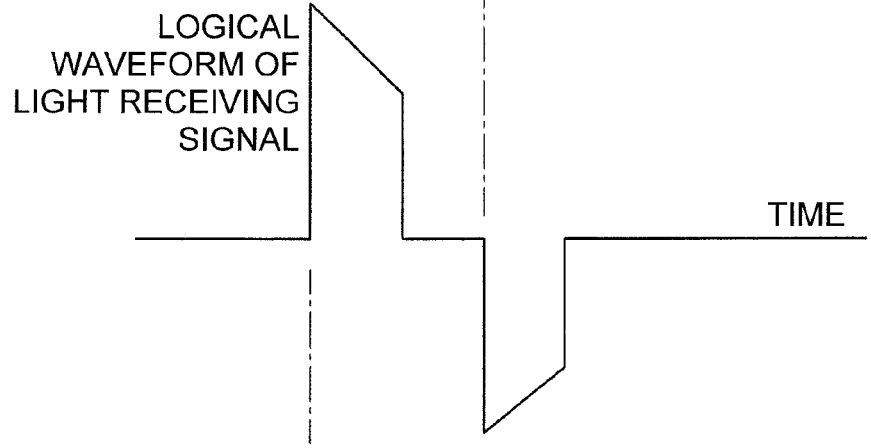
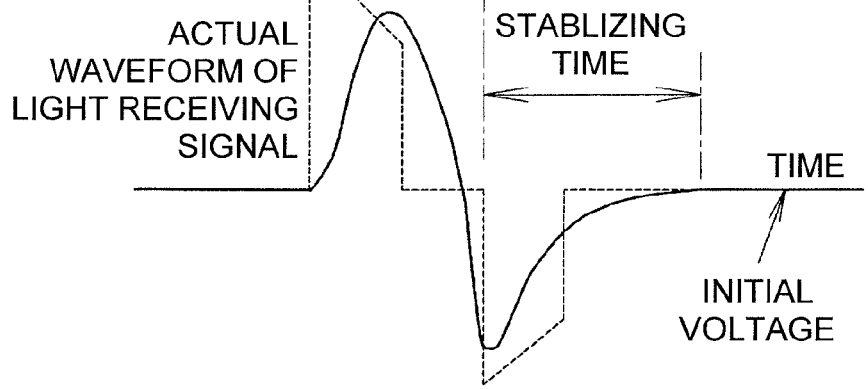

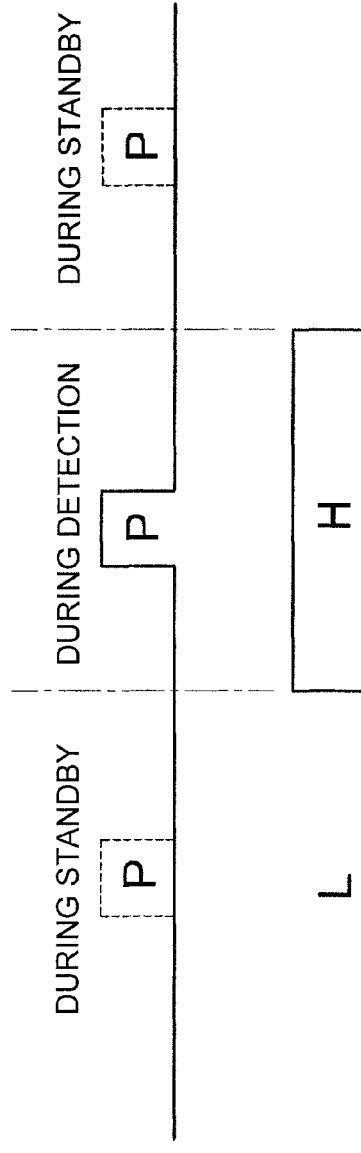
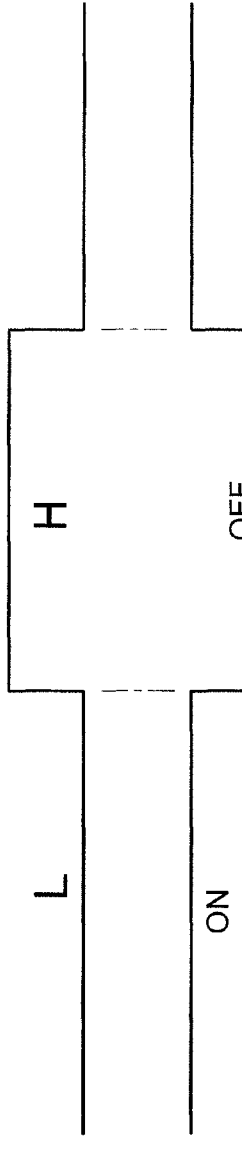
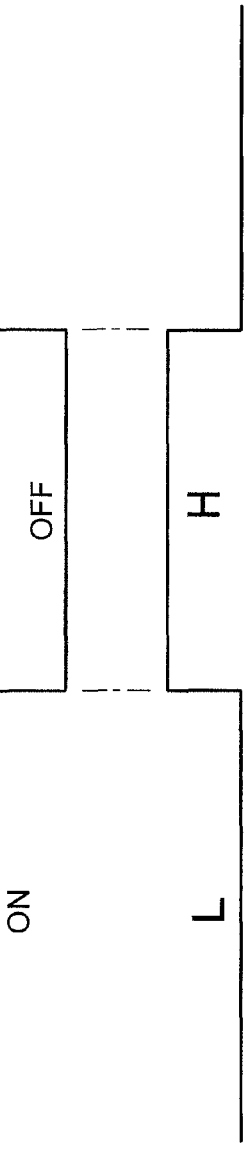
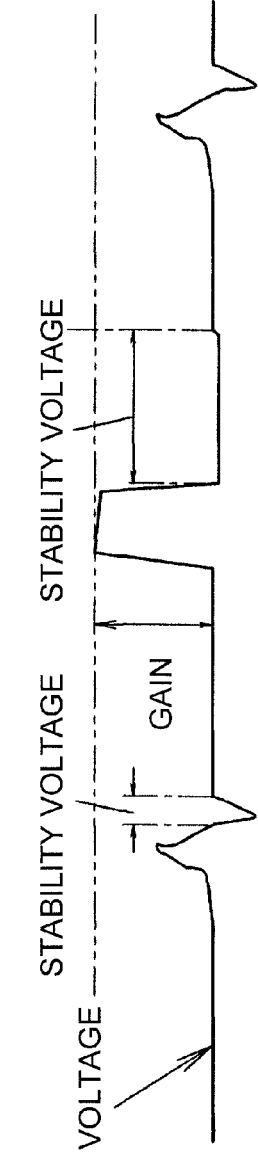
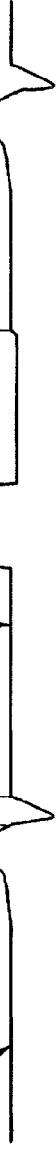
FIG. 8A LIGHT PULSE
FIG. 8B FILTER SWITCHING SIGNAL FS
FIG. 8C ANALOG SWITCH
FIG. 8D SWITCHING SIGNAL SwS
FIG. 8E LIGHT RECEIVING SIGNAL

LIGHT RECEIVING DETECTION CIRCUIT HAVING A HIGH-PASS FILTER AND AN AMPLIFYING CIRCUIT

BACKGROUND OF THE INVENTION

1. Technical Field

The present invention relates to a light receiving detection circuit, particularly to a light receiving detection circuit used in a photodetector of a light curtain.

2. Related Art

The light curtain is used as a safety device for an industrial machine and the like (for example, see OMRON corporation product information [online] Jan. 6, 2009, the Internet, <http://www.fa.omron.co.jp/product/family/1581/index_p.html>). FIG. 1 is a schematic diagram illustrating a configuration of a conventional light curtain. A light curtain 11 includes a projector 13 and a photodetector 15. The projector 13 includes plural projection elements 12 each of which includes a light emitting diode (LED). The photodetector 15 includes plural light receiving circuits 14, and a light receiving element is incorporated in each light receiving circuit 14. In the projector 13, the plural projection elements 12 are arrayed in line. In the photodetector 15, the plural light receiving elements 14 are arrayed in line such that the light receiving element 14 is paired with the projection element 12, a switch circuit 16 is connected to each light receiving circuit 14, output terminals of the switch circuits 16 are connected to one another, and the output terminals are connected to an input terminal of a high-pass filter circuit 17, and a signal passing through the high-pass filter circuit 17 is transmitted to a control circuit 18.

The projector 13 and the photodetector 15 are disposed while facing each other with a detection area interposed therebetween. Each projection element 12 emits a light beam toward the corresponding light receiving circuit 14, whereby a curtain or blind for detecting invasion is produced by the plural light beams. However, the projection elements 12 do not always emit the light beam, but the projection elements 12 circularly emit pulsed light beams in order at constant timing (hereinafter the pulsed light beam is referred to as light pulse P).

In the light curtain 11, when a hand or a foreign matter invades in the detection area between the projector 13 and the photodetector 15, the light pulse P passing through the portion is blocked, and the invasion of the hand or the foreign matter is sensed by the photodetector 15.

FIG. 2 is a circuit diagram illustrating a specific circuit configuration of the light receiving circuit 14. The light receiving circuit 14 includes a light receiving element 19 formed by a photodiode (PD), an I/V conversion circuit (current/voltage conversion circuit) 20, and a filter circuit 21. The I/V conversion circuit 20 includes an operational amplifier 23 to which negative feedback is applied by a resistor 22, and a reference power supply 24 is connected between a noninverting input terminal of the operational amplifier 23 and the ground. The light receiving element 19 is connected between an inverting input terminal of the operational amplifier 23 and the ground. The filter circuit 21 includes an amplifier 25, a capacitor 26, a resistor 27, and a DC power supply 28. The capacitor 26 is connected between an input terminal of the amplifier 25 and an output terminal of the I/V conversion circuit 20. The resistor 27 and the DC power supply 28 are connected in series, and the resistor 27 and the DC power supply 28 are also connected between an input of the amplifier 25 and the ground. A high-pass filter that cuts a low frequency component is formed by the capacitor 26 and resistor 27 that are connected into a tau-shape.

In the light receiving circuit 14, a current signal is passes through the light receiving element 19 when the light receiving element 19 receives the light pulse P, the I/V conversion circuit 20 converts the current signal into a voltage signal, stationary light and ambient light are cut by the filter circuit 21 including the capacitor 26 and resistor 27, and the voltage signal is amplified and outputted by the I/V conversion circuit 20 and the amplifier 25. The output signals of the light receiving circuits 14 that face the projection elements 12 emitting the pulsed light is selected by the switch circuit 16, and the selected output signal is fed into the control circuit 18 through the high-pass filter circuit 17.

In a light receiving circuit of the conventional light curtain 11, (1) a time (stability time) until the light receiving signal returns to an initial voltage is long, (2) a variation in gain is large, and (3) a variation in offset voltage outputted from the amplifier is large.

(Stability Time)

First the stability time until the light receiving signal returns to the initial voltage will be described. FIG. 3A illustrates the rectangular light pulse P, FIGS. 3B and 3C illustrate the light receiving signal that is outputted from the amplifier 25 in receiving the light pulse P of FIG. 3A. FIG. 3B illustrates a theoretical waveform of the light receiving signal, and FIG. 3C illustrates an actual waveform of the light receiving signal in consideration of a characteristic of the light receiving circuit 14. In the theoretical waveform, the steep rise and fall of the light receiving signal are exhibited as illustrated in FIG. 3B. On the other hand, in the actual waveform, the light receiving signal dulls and changes gently as illustrated in FIG. 3C, and the light receiving signal return gradually to the initial voltage while undershot after the light pulse P is turned off. At this point, the time until the light receiving signal returns to the initial voltage since the light pulse P is turned off is called stability time.

In the light curtain 11, the light pulse P has a pulse width of about 2.5 μsec on the projector side, and the light pulse P has a repetition period of about 30 μsec. When the light pulse P emitted from a certain projection element 12 is incident to the next-stage light receiving element 19 as illustrated in FIG. 1, the next-stage light receiving element 19 continuously receives the light pulses P in a short time interval as illustrated in FIG. 4. At this point, when the light receiving circuit 14 has the long stability time, in the light receiving element 19 and I/V conversion circuit 20 of the next stage, a signal derived from the light pulse P leaking out from the previous stage and a signal derived from the light pulse P from the corresponding projection element 12 overlap each other. As a result, the light receiving signal includes an error component, and normal detection cannot be performed in the light curtain 11.

In order to avoid the overlap of the light receiving signals, one may lengthen a repetition period of the light pulse P. However, when the repetition period of the light pulse P is lengthened, a proportion of the time the projector 13 does not emit the light pulse P increases to degrade detection accuracy of the light curtain 11. Therefore, in the conventional light curtain 11, the repetition frequency of the light pulse P is set to about 30 μsec, and a need for suppressing the stability time to 20 μsec or less arises.

(Variation in Gain)

In order to shorten the stability time as desired, it is necessary to raise a cutoff frequency of the filter circuit 21. In such cases, as illustrated in FIG. 3B, it is necessary to steeply outputted the pulsed light receiving signal. However, actually the response speed of the amplifier 25 does not follow the light receiving signal, and the light receiving signal becomes the dull-edged waveform as illustrated in FIG. 3C. The dull-edged waveform is influence by a circuit current value or a parasitic capacitance value. Therefore, in a semiconductor integrated circuit, a variation in gain increases in the light receiving circuit 14.

The control circuit 18 compares the fed light receiving signal to a threshold to determine whether or not the invasion is sensed. The threshold is determined based on the light receiving signal fed into the control circuit 18. Therefore, because the threshold becomes unstable when the gains of the I/V conversion circuits 20 vary, it is necessary to reduce the variation in gain of the light receiving circuit 14 in order to enhance the detection accuracy of the light curtain 11.

(Variation in Offset)

In the light receiving circuit 14 of FIG. 2, because the gain of the amplifier 25 is set to 100 times, an input offset voltage of the amplifier 25 is multiplied by 100, and the output offset voltage is supplied from the amplifier 25. For example, when the input offset voltage is ±3 mV, the output offset voltage becomes ±300 mV. As a result, the DC voltage of the initial voltage supplied from the amplifier 25 varies largely. An input level that can be amplified by the amplifier 25 decreases when the output DC voltage varies toward the positive side. Accordingly, it is necessary to suppress the variation in offset voltage supplied from the amplifier 25 as small as possible.

SUMMARY

One or more embodiments of the present invention improves the detection accuracy of the light receiving detection circuit (light receiving circuit) used in the light curtain. One or more embodiments of the present invention improves the detection accuracy of the light receiving detection circuit (light receiving circuit) used in the light curtain by reducing the variation in gain and the variation in output offset voltage while solving the problem with the stability time.

In accordance with one aspect of the present invention, there is provided a light receiving detection circuit that is provided in each of a plurality of light receiving elements in a light curtain, a projector including a plurality of projection elements and a photodetector including the plurality of light receiving elements facing each other in the light curtain, the light receiving detection circuit including: the light receiving element that receives light emitted from the corresponding projection element; a current/voltage conversion circuit that converts a current signal passing through the light receiving element into a voltage signal; and a filter portion that has a plurality of stages, the filter portion including a high-pass filter and an amplifying circuit, the high-pass filter being able to be switched such that a time constant of the high-pass filter increases when the corresponding projection element emits the light and such that the time constant decreases when other projection elements except for the corresponding projection element emit the light.

According to the light receiving detection circuit of one embodiment of the present invention, in the high-pass filter, a plurality of resistors connected in parallel are connected into a tau-shape to a capacitor, and an analog switch is connected in series to at least one of the resistors, the analog switch is turned off such that the time constant of the high-pass filter increases, and the analog switch is turned on such that the time constant of the high-pass filter decreases.

According to the above embodiment, the analog switch may be connected in series to each of the plurality of resistors connected in parallel.

According to the light receiving detection circuit of another embodiment of the present invention, in the high-pass filter, a plurality of resistors connected in parallel are connected in series to a capacitor, and an analog switch is connected in series to at least one of the resistors, the analog switch is turned off such that the time constant of the high-pass filter increases, and the analog switch is turned on such that the time constant of the high-pass filter decreases.

According to still another embodiment of the present invention, the analog switch may be connected in series to each of the plurality of resistors connected in parallel.

The high-pass filter in the light receiving detection circuit of one aspect of the invention can be switched such that the time constant increases in the period (during detection) in which the corresponding projection element emits the light while the time constant decreases in the period (during standby) in which the projection elements (hereinafter referred to as other projection elements) except for the corresponding projection element emit the light. Even if the leakage light is incident from other projection elements, because the stability time is shortened during standby of the high-pass filter, the light receiving signal returns immediately to the initial voltage after the light receiving signal is generated by the leakage light. Therefore, during detection, the detection accuracy of the light curtain can be improved because the light receiving signal is generated from the state in which the light receiving signal returns to the initial voltage.

When the light receiving signal output of each light receiving detection circuit is transmitted to the control circuit on one signal line, the detection accuracy of the light curtain can be improved because the light receiving signal outputs from the different light receiving detection circuits do not overlap.

During detection, the time constant increases while the cutoff frequency of the high-pass filter is lowered, so that a wider bandwidth of the light receiving detection circuit can be realized.

In the receiving detection circuit of one aspect of the invention, the filter portions are provided in plural stages. Therefore, the variation in output offset voltage can be reduced while the wider bandwidth of the light receiving detection circuit is realized, wave heights of the light receiving signals can substantially be equalized during detection.

In the light receiving detection circuit of one aspect of the invention, the time constant can be switched, the gain per one stage can be decreased by providing the filter portions in multiple stages, and the variation in gain can be reduced at a high frequency because the wider bandwidth is realized by decreasing the gain.

Accordingly, in one or more embodiments of the invention, the variation in gain and the variation in output offset voltage can be reduced while the wider bandwidth of the light receiving detection circuit is realized, and the receiving detection circuit with high-accuracy and high reliability can be implemented.

BRIEF DESCRIPTION OF THE DRAWINGS

FIG. 3 is a view illustrating a light receiving signal outputted from a light receiving circuit of FIG. 2 when a light pulse is received, FIG. 3A illustrates light emission timing of the light pulse, FIG. 3B illustrates a theoretical waveform of the light receiving signal, and FIG. 3C illustrates an actual waveform of the light receiving signal;

FIG. 8 is a timing chart illustrating a circuit operation of the light curtain;

DETAILED DESCRIPTION

Hereinafter, preferred embodiments of the present invention will be described with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

First Embodiment

Figure 1:
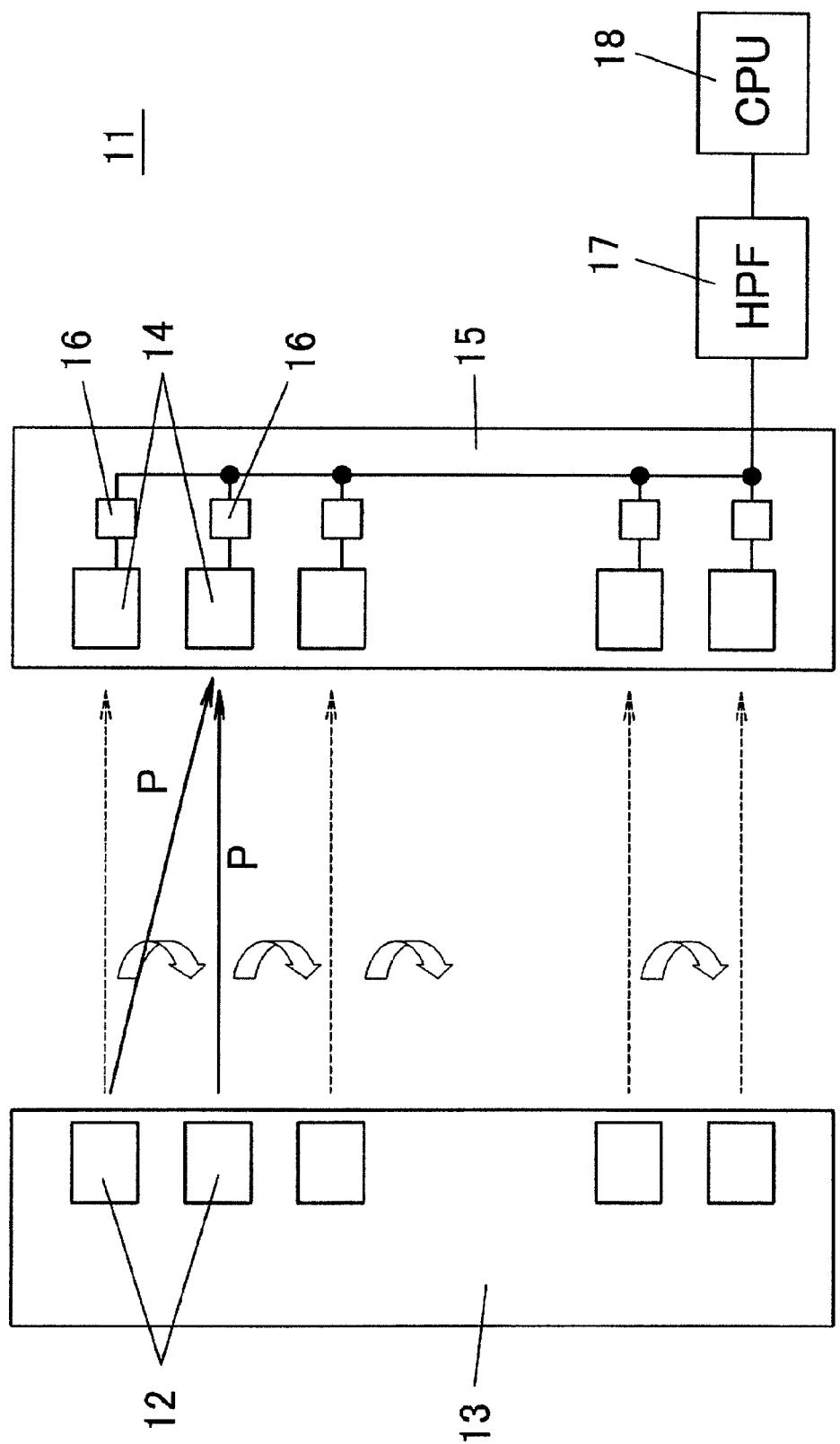
FIG. 1 is a schematic diagram illustrating a configuration of a conventional light curtain.
Figure 2:
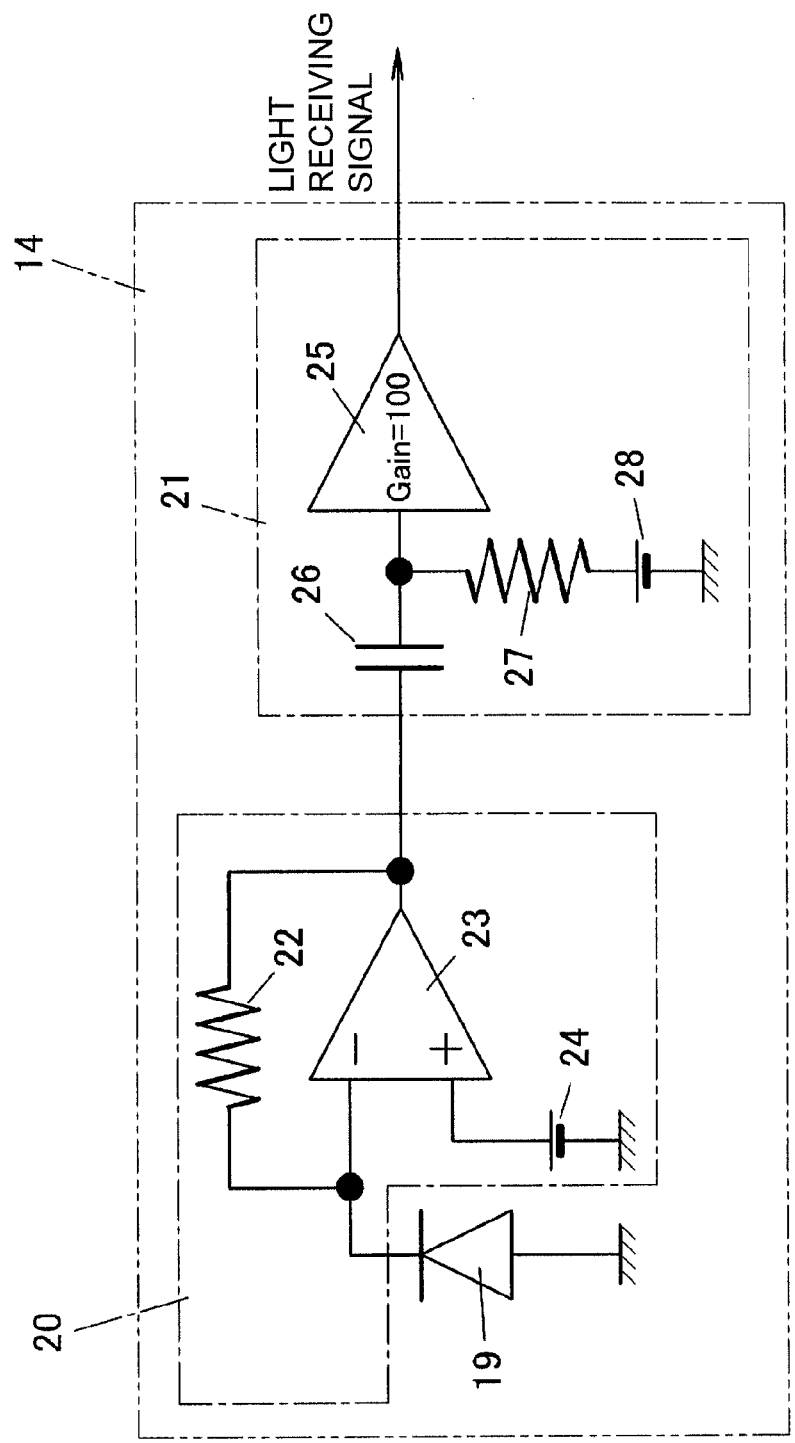
FIG. 2 is a circuit diagram illustrating a conventional light receiving circuit used in the light curtain.
Figure 4:
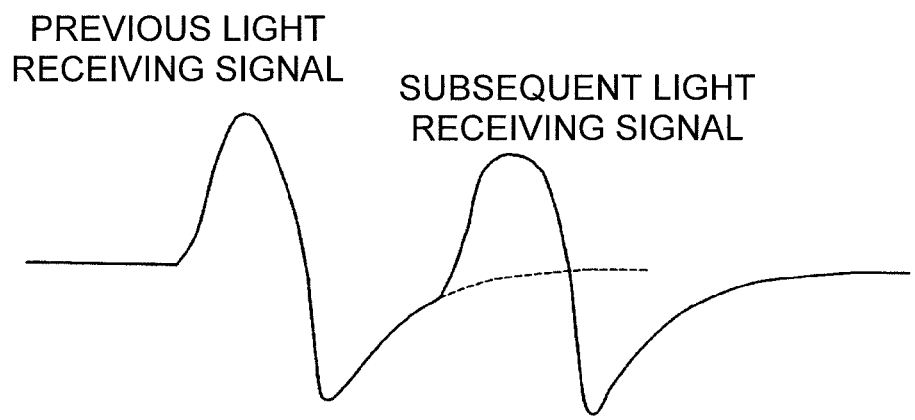
FIG. 4 is a waveform chart illustrating a state in which light receiving signals partially overlap each other.
Figure 5:
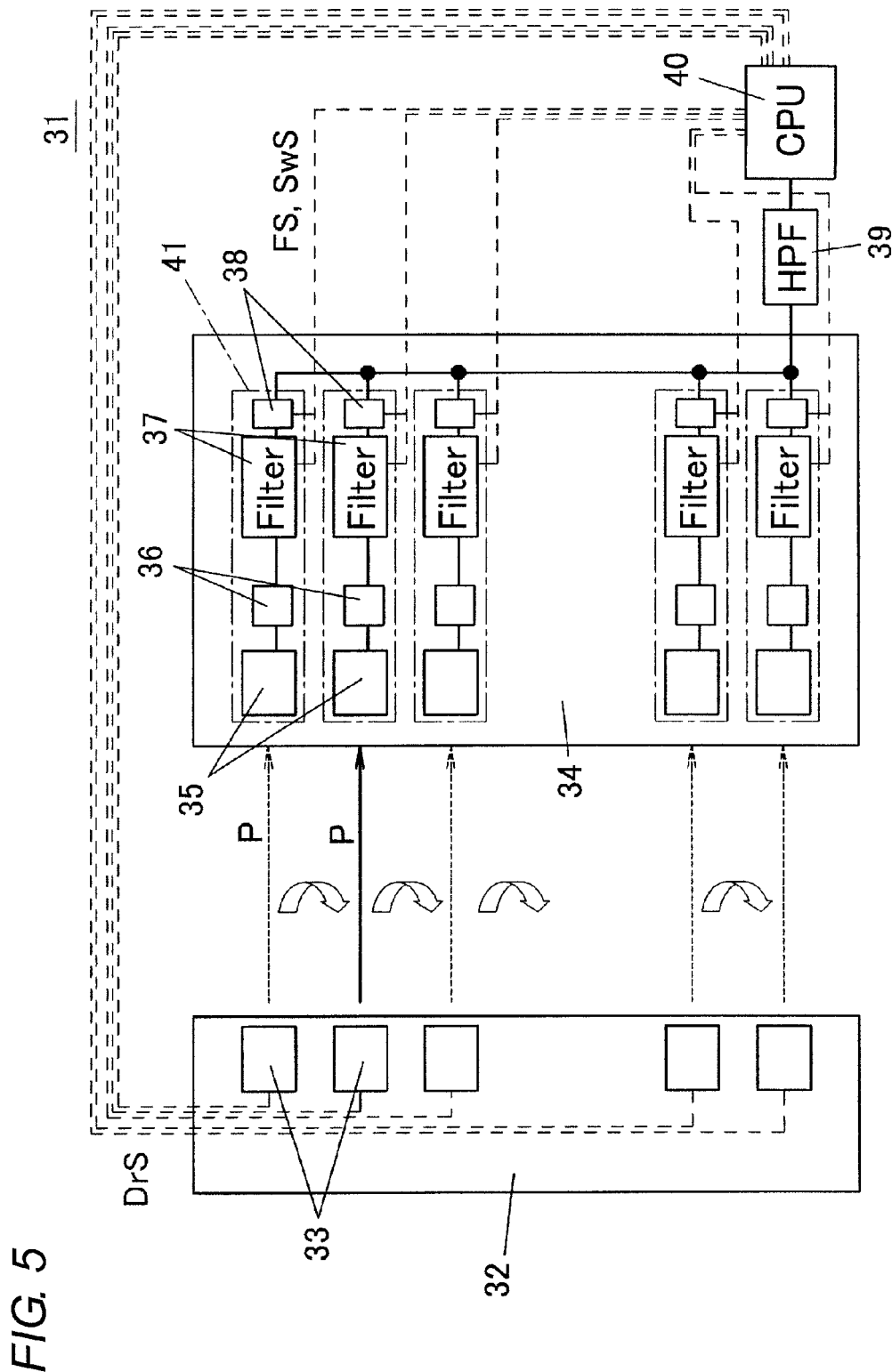
FIG. 5 is a schematic diagram illustrating a configuration of a light curtain according to a first embodiment of the invention.

FIG. 5 is a schematic diagram illustrating a configuration of a light curtain 31 according to a first embodiment of the invention. The light curtain 31 includes a projector 32, a photodetector 34, a high-pass filter circuit 39, and a control circuit 40. The projector 32 and the photodetector 34 are disposed while facing each other. In the projector 32, plural projection elements 33 each of which includes a light emitting diode (LED) are arrayed in line. During the operation, the projection elements 33 circularly emit pulsed light in order at constant timing by a driving signal DrS transmitted from a control circuit 40.

In the photodetector 34, plural light receiving elements 35 each of which includes a photodiode (PD) are arrayed in line such that the light receiving element 35 is paired with the projection element 33. An I/V conversion circuit (current/voltage conversion circuit) 36 is connected to each light receiving element 35, a filter circuit 37 is connected to each I/V conversion circuit 36, and a switch circuit 38 is connected to each filter circuit 37. That is, the photodetector 34 includes the plural photodetector-side circuit 41 each of which includes the light receiving element 35, the I/V conversion circuit 36, the filter circuit 37, and the switch circuit 38. Output terminals of the photodetector-side circuits 41, that is, output terminals of the switch circuits 38 are connected to one another, and the output terminals are connected as one signal line to a high-pass filter circuit 39. The high-pass filter circuit 39 is connected to a control circuit 40, the high-pass filter circuit 39 removes a high-frequency signal after superimposing light receiving signals outputted from the photodetector-side circuits 41, and the high-pass filter circuit 39 transmits the light receiving signal to the control circuit 40.

Figure 6:
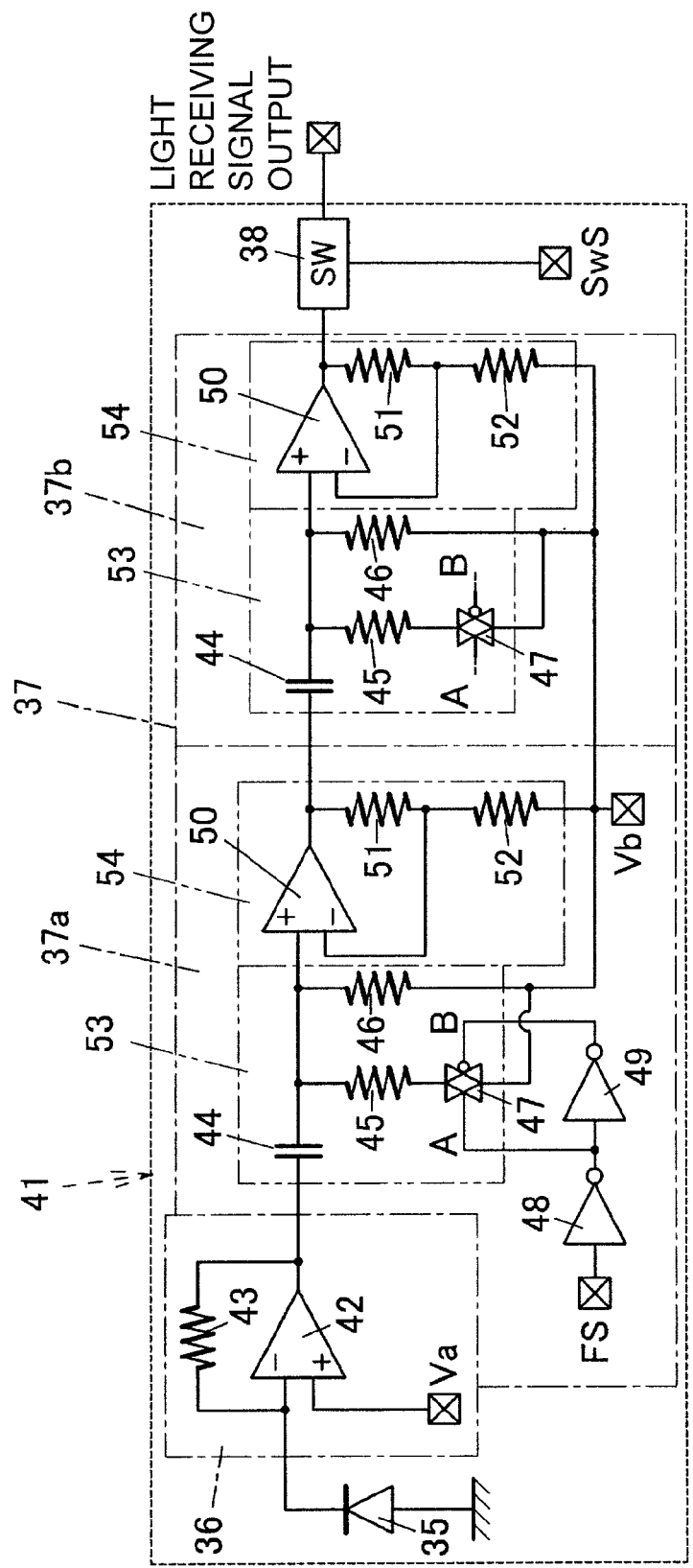
FIG. 6 is a circuit diagram illustrating a photodetector-side circuit used in the light curtain of the first embodiment.

FIG. 6 is a circuit diagram illustrating the light receiving detection circuit of the first embodiment, that is, the photodetector-side circuit 41. The photodetector-side circuit 41 includes the light receiving element 35, the I/V conversion circuit 36, the filter circuit 37, and the switch circuit 38, and each photodetector-side circuit 41 is formed as one-chip IC.

As illustrated in FIG. 6, the I/V conversion circuit 36 is formed by an operational amplifier 42 (negative feedback amplifying circuit) in which a resistor 43 is connected between an inverting input terminal and an output terminal, and a bias voltage Va (0.5V) is applied to a noninverting input terminal of the operational amplifier 42. In the light receiving element 35 including the photodiode, a cathode is connected to the inverting input terminal of the operational amplifier 42, and an anode is connected to the ground.

When one of the light receiving elements 35 receives the light pulse, a current signal (photocurrent) is passed through the light receiving element 35. The I/V conversion circuit 36 performs current-voltage conversion of the current signal, and the I/V conversion circuit 36 taps off the voltage signal while amplifying the voltage signal. The voltage signal is fed into the filter circuit 37 from the I/V conversion circuit 36.

The filter circuit 37 includes a first-stage filter portion 37a and a second-stage filter portion 37b.

The first-stage filter portion 37a and the second-stage filter portion 37b have the same circuit configuration. In the filter portions 37a and 37b, a capacitor 44 and parallel-connected resistors 45 and 46 are connected into tau-shape to form a high-pass filter 53, and a resistor 51 is connected between an output terminal and an inverting input terminal of an operational amplifier 50 to form an amplifying circuit 54 (negative feedback amplifying circuit). Therefore, the filter circuit 37 is formed by two stages of the high-pass filters 53 and the amplifying circuits 54. An amplification factor of the amplifying circuit 54 is set to about 10 times.

In the high-pass filter 53, a filter characteristic is switched by turning on (closed) and off (opened) an analog switch 47. The resistor 45 and the analog switch 47 are connected in series, and the resistor 46 and the series-connected resistor 45 and analog switch 47 are connected in parallel, one end of the parallel connection of the resistor 46 and the resistor 45 and analog switch 47 is connected to an output-side terminal of the capacitor 44, and a bias voltage Vb (2V) is applied to the other end. Therefore, a combined resistance value of the resistors 45 and 46 is changed by turning on and off the analog switch 47, thereby changing a characteristic (cutoff frequency) of the tau-shape high-pass filter 53.

The inverters 48 and 49 are connected in series, a filter switching signal FS is fed into the inverter 48, a midpoint of the inverters 48 and 49 is connected to an A control terminal (positive side) of the analog switch 47, and an output of the inverter 49 is connected to a B control terminal (negative side) of the analog switch 47. In the second-stage filter portion 37b of FIG. 6, although wiring between the analog switch 47 and the inverters 48 and 49 is omitted, the second-stage analog switch 47 and the inverters 48 and 49 (shared by first stage and second stage) are connected like the first-stage filter portion 37a. Therefore, the analog switch 47 of each stage can be switched by the filter switching signal FS, each analog switch 47 is turned off when the H-level filter switching signal FS is fed into the inverter 48, and each analog switch 47 is turned on when the L-level filter switching signal FS is fed into the inverter 48. The control circuit 40 controls the filter switching signal FS.

In the amplifying circuit 54, the resistor 51 is connected between the inverting input terminal and output terminal of the operational amplifier 50 to form the negative feedback amplifying circuit, and the bias voltage Vb is applied to the inverting input terminal of the operational amplifier 50 through a resistor 52. A connection point of the capacitor 44 and the resistors 45 and 46 is connected to the noninverting input terminal of the operational amplifier 50.

The opening and closing of the switch circuit 38 is controlled by a switching signal SwS. When the switching signal SwS is maintained at the H-level, the light receiving signal can be transmitted from the filter circuit 37 to the control circuit 40 through the high-pass filter circuit 39. When the switching signal SwS is set to the L-level, the light receiving signal can be blocked so as not to be outputted from the filter circuit 37. The control circuit 40 controls the switching signal SwS.

In the filter portions 37a and 37b, the input-side terminal of the capacitor 44 constitutes an input portion, and the output terminal of the operational amplifier 50 constitutes an output portion. In the first-stage filter portion 37a, the input portion (input-side terminal of capacitor 44) is connected to the output of the I/V conversion circuit 36. The output portion (output terminal of operational amplifier 50) of the first-stage filter portion 37a is connected to the input portion (input-side terminal of capacitor 44) of the second-stage filter portion 37b. In the second-stage filter portion 37b, the output portion (output terminal of operational amplifier 50) is connected to the switch circuit 38.

An operation of the photodetector-side circuit 41 will be described below. In the photodetector-side circuit 41, the analog switch 47 switches a constant of the high-pass filter 53. Assuming that Ra and Rb are resistance values of the resistors 45 and 46, the resistors 45 and 46 becomes the combined resistance value of Rb when the analog switch 47 is turned off, and the resistors 45 and 46 becomes the combined resistance value of Ra Rb/(Ra+Rb) when the analog switch 47 is turned on. Particularly, in the case of Ra<<Rb, the combined resistance value is obtained as follows when the analog switch 47 is turned on:

$$Ra \cdot Rb/(Ra+Rb) \approx Ra$$

For example, assuming that the resistor 45 has the resistance value Ra of 5 kΩ, the resistor 46 has the resistance value Rb of 1 MΩ, and the capacitor 44 has the capacitance C of 100 pF, the combined resistance value is obtained as follows when the analog switch 47 is turned off:

$$Rb = 1 \text{ M}\Omega$$

At this point, a CR time constant (relaxation time) of the high-pass filter 53 is obtained as follows:

$$Rb \cdot C = 1 \times 10^{-4} \text{ sec}$$

And a cutoff frequency of the high-pass filter 53 is obtained as follows:

$$fc1 = 1/(2\pi Rb \cdot C) = 1.59 \text{ kHz}$$

The combined resistance value of the resistors 45 and 46 is obtained as follows when the analog switch 47 is turned on:

$$Ra \cdot Rb/(Ra+Rb) \approx Ra = 5 \text{ k}\Omega$$

At this point, the CR time constant of the high-pass filter 53 is obtained as follows:

$$Ra \cdot C = 5 \times 10^{-7} \text{ sec}$$

And the cutoff frequency of the high-pass filter 53 is obtained as follows:

$$fc2 = 1/(2\pi Ra \cdot C) = 318 \text{ kHz}$$

Figure 7:
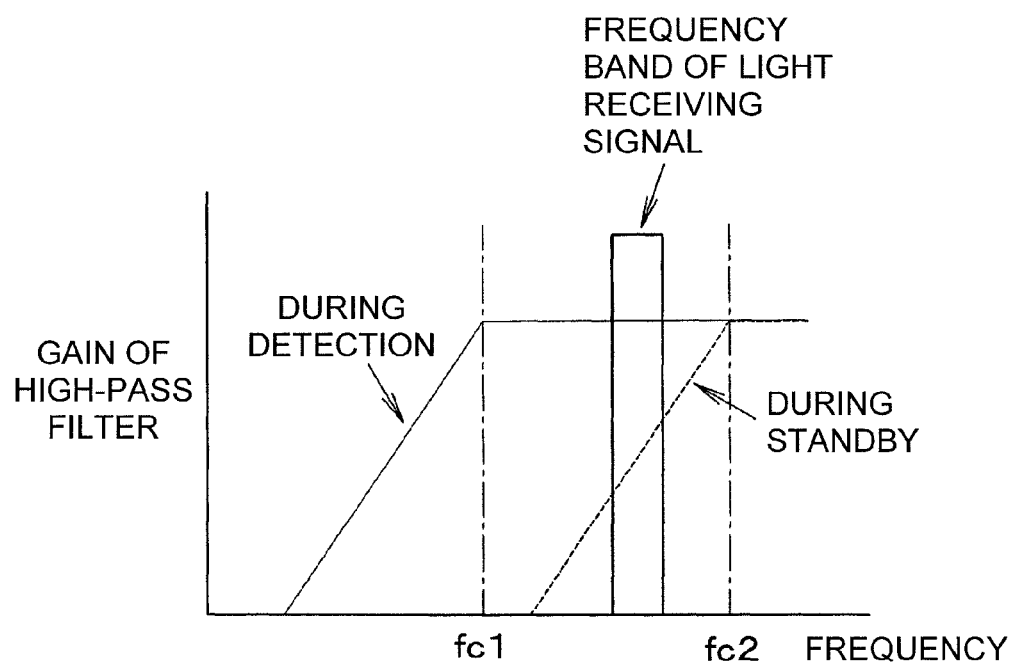
FIG. 7 is a view illustrating a frequency characteristic of a high-pass filter when an analog switch is turned off (during detection) and on (during standby)

As illustrated in FIG. 7, the cutoff frequency fc1 and fc2 are determined as follows:

$$fc1 < \text{frequency band of light receiving signal fed into high-pass filter } 53 < fc2$$

FIG. 8 is a timing chart illustrating an operation of the light curtain 31. FIG. 8A illustrates the light pulse P that is generated at constant time intervals by the driving signal DrS from the control circuit 40. In FIG. 8A, the light pulse P indicated by a solid line expresses a light pulse emitted from the projection element 33 corresponding to the photodetector-side circuit 41, and the light pulse P indicated by a broken line expresses a light pulse emitted from the projection element 33 except for the projection element 33 corresponding to the photodetector-side circuit 41. FIG. 8(b) illustrates the filter switching signal FS fed from the control circuit 40 into the filter circuit 37. FIG. 8C illustrates a state of the analog switch 47 turned on and off by the filter switching signal FS. FIG. 8D illustrates the switching signal SwS fed from the control circuit 40 into the switch circuit 38. FIG. 8E illustrates a waveform of the light receiving signal outputted from the filter circuit 37. During detection, the light receiving signal is derived from the light pulse P emitted from the corresponding projection element 33. During standby, the light receiving signal is derived from the light pulse P (leakage light) that leaks out from the projection element 33 except for the corresponding projection element 33.

When a certain photodetector-side circuit 41 is taken as an example, in a light emission period (during standby) of the projection element 33 except for the corresponding projection element 33, the analog switch 47 is turned on because the filter switching signal FS is set to the L-level as illustrated in FIGS. 8B and 8C. Accordingly, during standby, the CR time constant of the high-pass filter 53 decreases to shorten the stability time of the light receiving signal as illustrated in FIG. 8E. As a result, even if the leakage light is incident to the projection element 33 to generate the light receiving signal during standby, the level of the light receiving signal returns quickly to the initial voltage, so that the detection operation can always be performed from the initial voltage during detection to improve detection accuracy of the photodetector-side circuit 41.

In a light emission period (during detection) of the corresponding projection element 33, the analog switch 47 is turned off because the filter switching signal FS is set to the H-level as illustrated in FIGS. 8B and 8C. Accordingly, during detection, the CR time constant of the high-pass filter 53 becomes longer than that of the standby state, and the cutoff frequency becomes the frequency fc1 that is lower than the frequency band of the light receiving signal fed into the high-pass filter 53, thereby becoming wider bandwidth of the high-pass filter 53. The variation in gain is reduced, and the light receiving signal is transmitted without attenuating gain amplitude of the light receiving signal as illustrated in FIG. 8E, so that the detection accuracy of the photodetector-side circuit 41 can be improved.

Although the CR time constant increases during detection, the CR time constant decreases during standby, and therefore the level of the light receiving signal returns quickly to the initial voltage. Even if the CR time constant increases during detection, the next light receiving signal is not influenced, so that the detection accuracy of the photodetector-side circuit 41 can be improved.

In the photodetector-side circuit 41, the CR time constant decreases to shorten the stability time during standby, so that a projection interval of the light curtain 31 can be shortened to maintain the detection accuracy and reliability of the light curtain.

In the photodetector-side circuit 41, the filter portions 37a and 37b are formed into two stages. Therefore, (1) the variation in output offset voltage of the photodetector-side circuit 41 can be suppressed, and (2) the frequency bands (passband on high frequency side) of the filter portions 37a and 37b can be broadened. The reason for the point (1) will be described. It is assumed that a target gain is 100 times and the variation in input offset voltage Vb ranges within ±3 mV. Assuming that the 100-time gain is obtained in the one-stage filter portion, the output offset voltage is theoretically computed as follows:

$$100 \times \pm 3 \text{ mV} = \pm 300 \text{ mV}$$

On the other hand, for the two-stage filter portion, the gain of one stage becomes 10 times. Additionally, because the influence of the first-stage output offset voltage is removed by the AC coupling (capacitor 44), it is only necessary to consider the second-stage offset. As a result, the total output offset voltage is obtained as follows:

$$10 \times \pm 3 \text{ mV} = \pm 30 \text{ mV}$$

The total output offset voltage of the two-stage filter portion is extremely smaller than that of one-stage filter portion.

Figure 9:
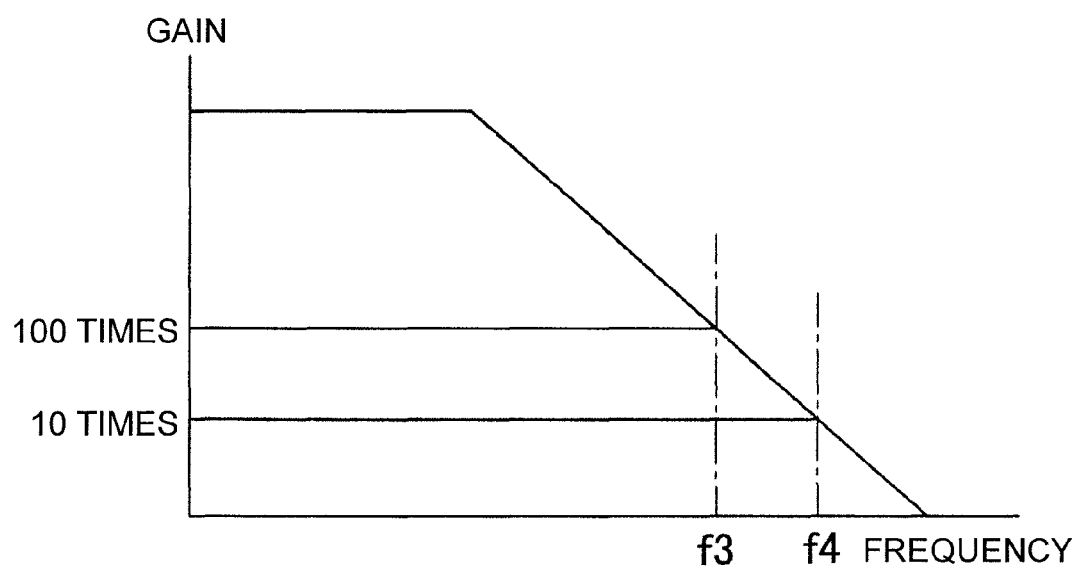
FIG. 9 is a view illustrating an open-loop characteristic of a general amplifier.

The reason for the point (2) will be described with reference to FIG. 9. FIG. 9 is a view illustrating an open-loop characteristic of a general amplifier. In FIG. 9, a vertical axis indicates a gain in terms of logarithmic scale and a horizontal axis indicates a frequency in terms of logarithmic scale. Assuming that the target gain is 100 times, the band frequency is set to f3 when the 100-time gain is obtained in the one-stage filter portion. On the other hand, when the 100-time gain is obtained in two-stage filter portion, because the gain per one stage can be set to 10 times, the band frequency becomes f4. Therefore, the band frequency of about 10 times that is of the band frequency of one-stage configuration can be realized by the two-stage filter portion.

In order that the variation in output offset voltage supplied from the operational amplifier 50 decreases by the variation in input offset voltage Vb of the amplifying circuit 54, desirably the gain of the first-stage filter portion 37a is set to a high level while the gain of the second-stage filter portion 37b is set to a low level. At this point, the cutoff frequency fc1 of the first-stage filter portion 37a is lowered and the wider bandwidth is hardly realized.

Therefore, the gains of the first-stage filter portion 37a and second-stage filter portion 37b are set to the same value. For example, when the 100-time gain is required, both the first-stage and second-stage gains are set to 10 times, and the filter circuit 37 is operated in the wide frequency band while the variation in output offset voltage is suppressed to some extent. In the first embodiment, the first-stage filter portion 37a and the second-stage filter portion 37b are formed by the circuit elements having the same circuit constant in order to equalize the first-stage and second-stage gains.

In the photodetector-side circuit 41, as illustrated in FIG. 8D, only during detection, the switching signal SwS is maintained at the H-level to turn on the switch circuit 38, which allows the light receiving signal to be outputted to the control circuit 40. On the other hand, during standby, the switching signal SwS is set to the L-level to turn off the switch circuit 38. Accordingly, during standby, in the photodetector-side circuit 41, because the switch circuit 38 is turned off and the light receiving signal is not outputted, the reliability is improved in the detection operation of the light curtain 31. Further, even during standby, the switch circuit 38 can be turned off while the I/V conversion circuit 36 and the filter portions 37a and 37b are maintained in the operating state. Therefore, when the standby state is switched to the detection state, the circuit operation is stabilized to improve the reliability in the detection operation of the light curtain 31 compared with the method for setting the I/V conversion circuit 36 or the filter portions 37a and 37b to the circuit stopping state during standby.

Accordingly, in the light curtain 31 of the first embodiment, the detection operation is stabilized when the hand or the foreign matter invades in the detection area between the projector 13 and the photodetector 15, and the high accuracy and high reliability of the detection operation can be achieved.

In the photodetector-side circuit 41, because the analog switches 47 of the stages are simultaneously switched by one signal (filter switching signal FS), the switching of the filter portion of each stage can be synchronized, and the switching timing is not deviated.

Second Embodiment

Figure 10:
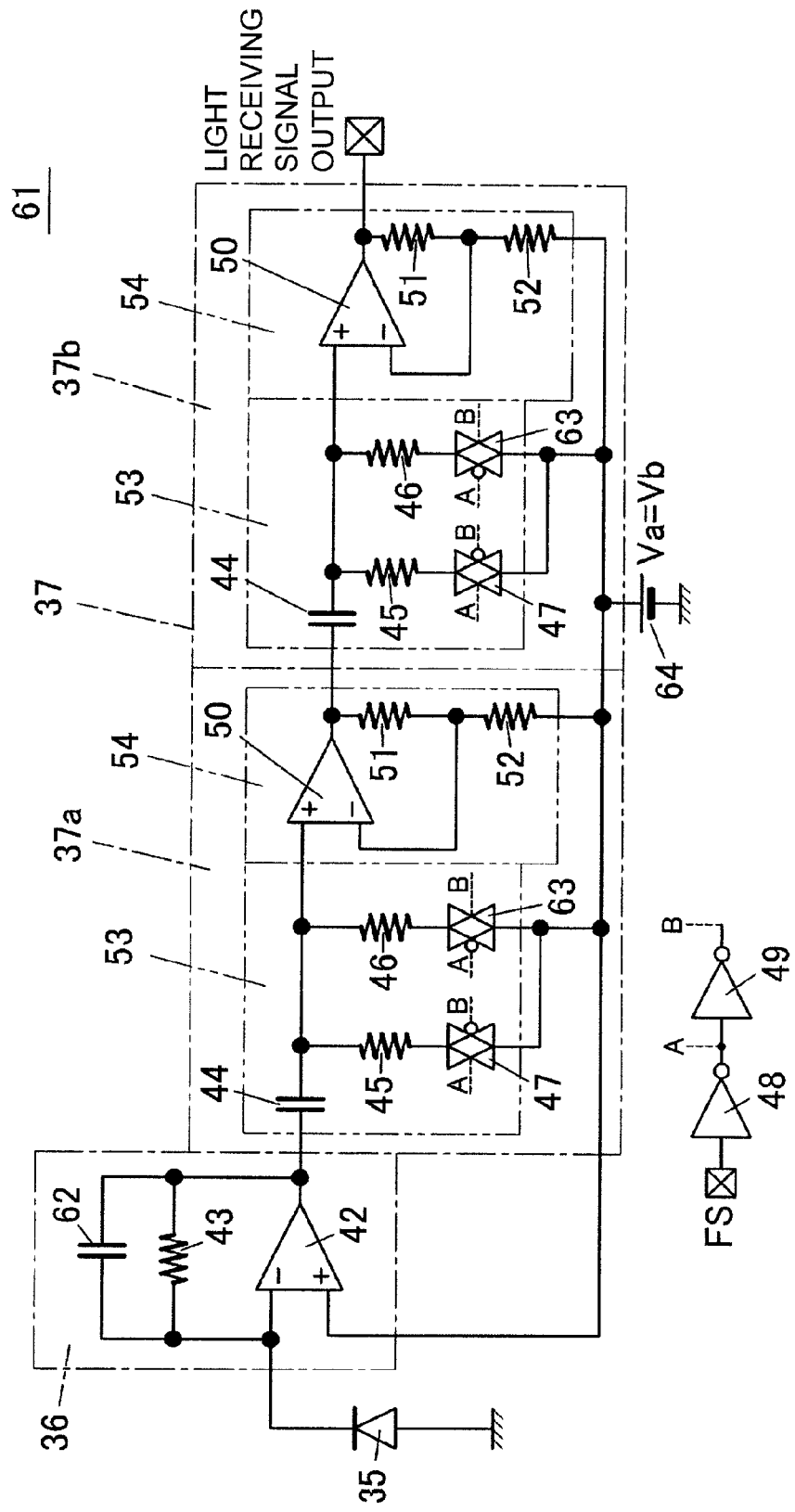
FIG. 10 is a circuit diagram illustrating a photodetector-side circuit according to a second embodiment of the invention.

FIG. 10 is a circuit diagram illustrating a photodetector-side circuit 61 according to a second embodiment of the invention. In the I/V conversion circuit 36 of the photodetector-side circuit 61, the resistor 43 and a capacitor 62 are connected in parallel between the output terminal and inverting input terminal of the operational amplifier 42.

In the high-pass filter 53, an analog switch 63 is connected in series to the resistor 46. When the filter switching signal FS becomes the H-level, the analog switch 47 is turned off, the analog switch 63 is turned on, the resistors 45 and 46 has the combined resistance value of Rb, and the cutoff frequency of the high-pass filter 53 becomes $1/(2\pi Rb \cdot C)$. On the other hand, when the filter switching signal FS becomes the L-level, the analog switch 47 is turned on, the analog switch 63 is turned off, the resistors 45 and 46 has the combined resistance value of Ra, and the cutoff frequency of the high-pass filter 53 becomes $1/(2\pi Ra \cdot C)$. Where C is a capacitance of the capacitor 44, Ra is a resistance value of the resistor 45, and Rb is a resistance value of the resistor 46.

The bias voltage Va and the bias voltage Vb are equalized to each other, and a constant voltage source 64 provides the bias voltages Va and Vb.

Third Embodiment

Figure 11:
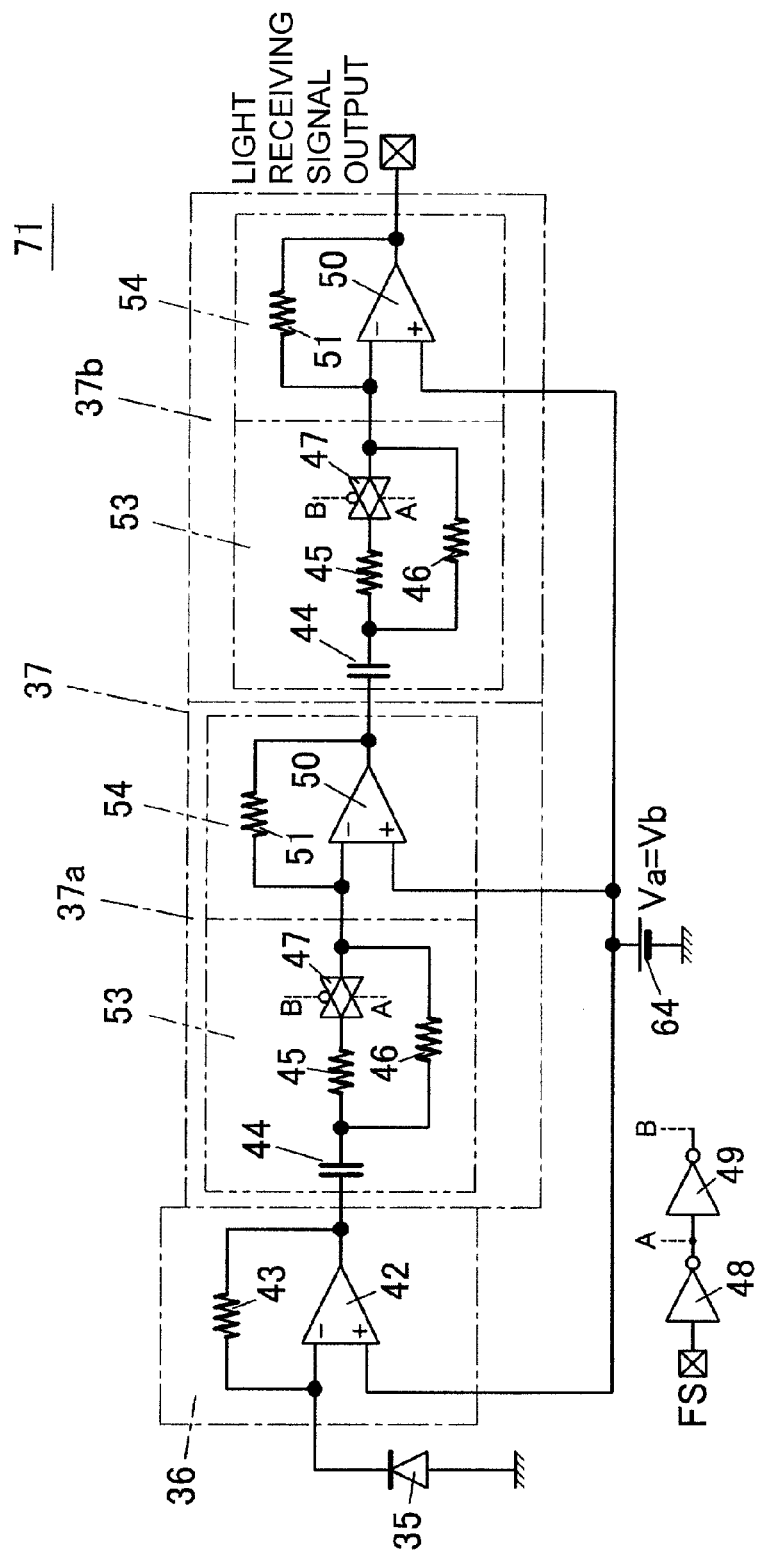
FIG. 11 is a circuit diagram illustrating a photodetector-side circuit according to a third embodiment of the invention.

FIG. 11 is a circuit diagram illustrating a photodetector-side circuit 71 according to a third embodiment of the invention. The photodetector-side circuit 71 is formed in the form of inverting amplifier. In the photodetector-side circuit 71, the resistor 45 and the analog switch 47 are connected in series, the resistor 46 and the series-connected resistor 45 and analog switch 47 are connected in parallel, and the parallel connection of the resistor 46 and the series-connected resistor 45 and analog switch 47 is inserted between the capacitor 44 and the inverting input terminal of the operational amplifier 50. The resistor 51 is connected between the output terminal and inverting input terminal of the operational amplifier 50 to provide the bias voltage Vb (=Va) to the noninverting input terminal of the operational amplifier 50.

Fourth Embodiment

Figure 12:
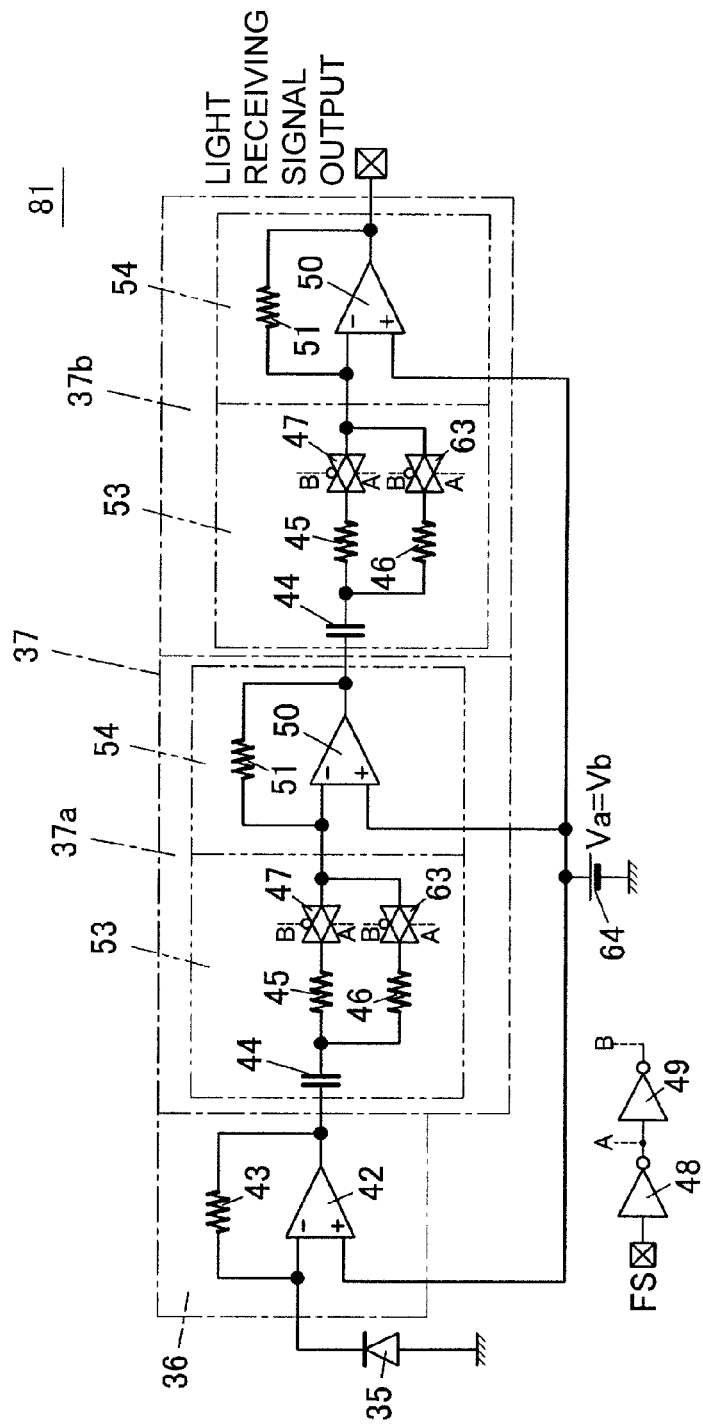
FIG. 12 is a circuit diagram illustrating a photodetector-side circuit according to a fourth embodiment of the invention.

FIG. 12 is a circuit diagram illustrating a photodetector-side circuit 81 according to a fourth embodiment of the invention. In the photodetector-side circuit 81, the analog switch 63 is also connected in series to the resistor 46 in the photodetector-side circuit 71 of the third embodiment such that the analog switch 47 and the analog switch 63 are alternatively turned on and off by the filter switching signal FS.

Fifth Embodiment

Figure 13:
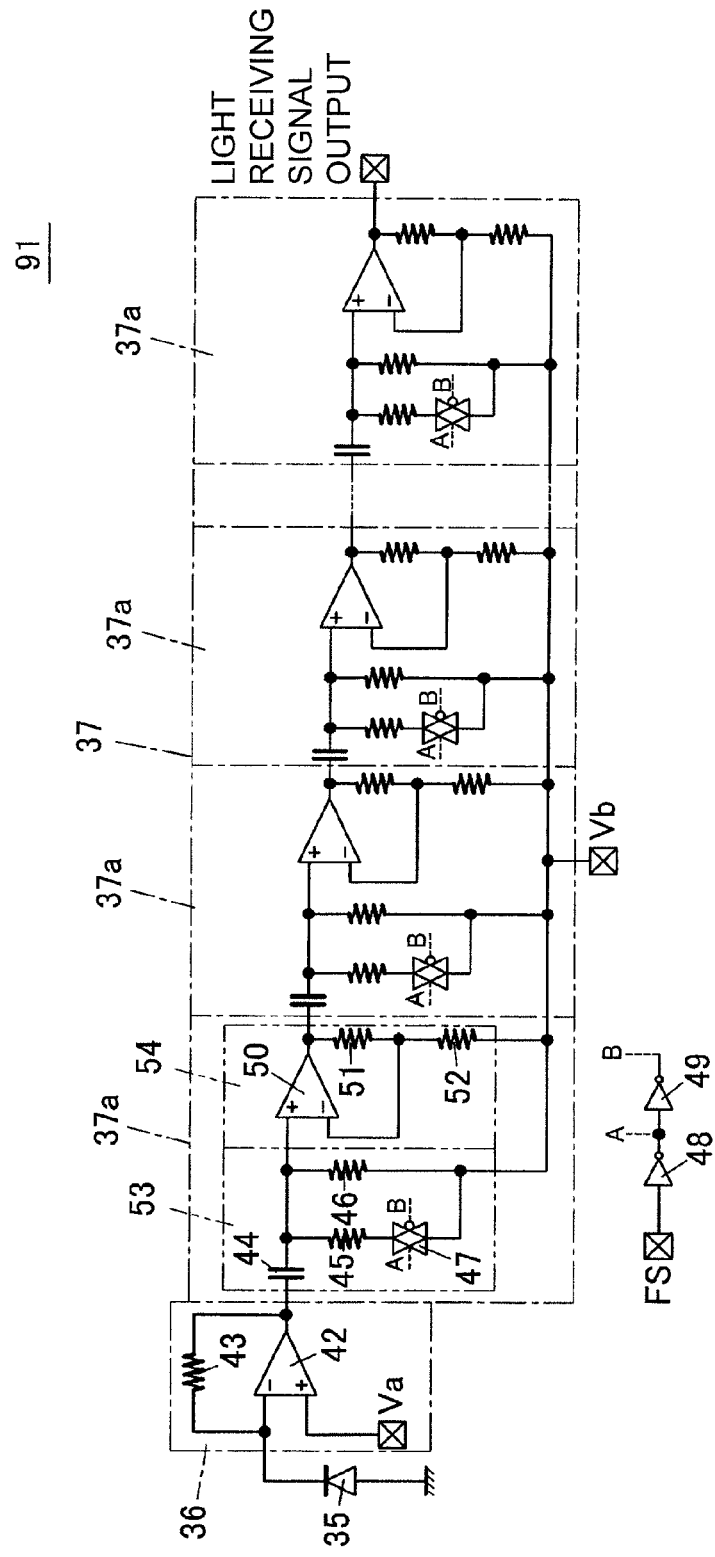
FIG. 13 is a circuit diagram illustrating a photodetector-side circuit according to a fifth embodiment of the invention.

FIG. 13 is a circuit diagram illustrating a photodetector-side circuit 91 according to a fifth embodiment of the invention. In the photodetector-side circuit 91, the filter portions identical to the first-stage filter portion 37*a* are connected in at least three stages to form the filter circuit 37.
In the fifth embodiment, the variation in output offset voltage of the photodetector-side circuit 91 can further be suppressed, and the frequency band (passband on high frequency side) of the filter portion 37*a* can further be broadened.

Although not illustrated, in another embodiment, at least two kinds of circuits may be connected in plural stages to form the filter circuit 37 in the circuit like the filter portion of the first embodiment, the circuit like the filter portion of the second embodiment, the circuit like the filter portion of the third embodiment, and the circuit like the filter portion of the fourth embodiment.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A light receiving detection circuit comprising:
   a light receiving element configured to receive light emitted from a corresponding projection element;
   a current/voltage conversion circuit that converts a current signal passing through the light receiving element into a voltage signal; and
   a filter portion that has a plurality of stages,
   wherein the filter portion comprises a high-pass filter and an amplifying circuit, and
   wherein the high-pass filter is able to be switched such that a time constant of the high-pass filter increases when the light receiving element receives light emitted by the corresponding projection element and such that the time constant decreases when other projection elements, except for the corresponding projection element, emit the light,
   wherein, in the high-pass filter, a plurality of resistors connected in parallel are connected in series to a capacitor, and an analog switch is connected in series to at least one of the resistors,
   the analog switch is turned off such that the time constant of the high-pass filter increases, and
   the analog switch is turned on such that the time constant of the high-pass filter decreases.

2. The light receiving detection circuit according to claim 1, wherein the analog switch is connected in series to each of the plurality of resistors connected in parallel.

3. A light curtain comprising:
   a photodetector comprising a plurality of light receiving detection circuits; and
   a projector comprising a plurality of projection elements,
   wherein the projector is disposed opposite the photodetector,
   wherein each of the plurality of light receiving detection circuit comprises:
      a light receiving element that receives light emitted from the corresponding projection element;
      a current/voltage conversion circuit that converts a current signal passing through the light receiving element into a voltage signal; and
      a filter portion that has a plurality of stages,
   wherein the filter portion comprises a high-pass filter and an amplifying circuit, and
   wherein the high-pass filter is able to be switched such that a time constant of the high-pass filter increases when the corresponding projection element emits the light and such that the time constant decreases when other projection elements, except for the corresponding projection element, emit the light,
   wherein, in the high-pass filter, a plurality of resistors connected in parallel are connected in series to a capacitor, and an analog switch is connected in series to at least one of the resistors,
   the analog switch is turned off such that the time constant of the high-pass filter increases, and
   the analog switch is turned on such that the time constant of the high-pass filter decreases.

4. The light receiving detection circuit according to claim 3, wherein the analog switch is connected in series to each of the plurality of resistors connected in parallel.

* * * * *